(12) United States Patent
Rachmady et al.

(10) Patent No.: US 8,344,418 B2
(45) Date of Patent: Jan. 1, 2013

(54) MATERIALS FOR INTERFACING HIGH-K DIELECTRIC LAYERS WITH III-V SEMICONDUCTORS

(75) Inventors: Willy Rachmady, Beaverton, OR (US); Marko Radosavljevic, Beaverton, OR (US); Gilbert Dewey, Hillsboro, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 350 days.

(21) Appl. No.: 12/646,436

(22) Filed: Dec. 23, 2009

(65) Prior Publication Data

US 2011/0147795 A1   Jun. 23, 2011

(51) Int. Cl.
*H01L 31/102*   (2006.01)

(52) U.S. Cl. .......... 257/189; 438/48; 438/197; 438/216; 438/287; 257/E21.398; 257/E21.386

(58) Field of Classification Search .................... 257/189
See application file for complete search history.

(56) References Cited

U.S. PATENT DOCUMENTS

| | | | |
|---|---|---|---|
| 2003/0073258 A1* | 4/2003 | Mukai et al. | 438/29 |
| 2006/0135669 A1* | 6/2006 | Ryang | 524/430 |
| 2007/0123003 A1* | 5/2007 | Brask et al. | 438/478 |

* cited by examiner

*Primary Examiner* — Ajay K Arora

(74) *Attorney, Agent, or Firm* — Blakely, Sokoloff, Taylor & Zafman LLP

(57) ABSTRACT

A group III chalcogenide layer for interfacing a high-k dielectric to a III-V semiconductor surface and methods of forming the same. A III-V QWFET includes a gate stack which comprises a high-K gate dielectric layer disposed on an interfacial layer comprising a group III chalcogenide. In an embodiment, a III-V semiconductor surface comprising a native oxide is sequentially exposed to TMA and $H_2S$ provided in an ALD process to remove substantially all the native oxide and form an $Al_2S_3$ layer on the semiconductor surface.

17 Claims, 4 Drawing Sheets

MATERIALS FOR INTERFACING HIGH-K DIELECTRIC LAYERS WITH III-V SEMICONDUCTORS

TECHNICAL FIELD

Embodiments of the invention are in the field of Semiconductor Devices and, more particularly, to materials for interfacing insulting layers having a high dielectric constant to III-V compound semiconductors.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity.

Recently, research on III-V devices like high electron mobility transistors (HEMT) employing quantum-well field effect transistors (QWFET) has increased. Quantum-well devices are typically formed in epitaxially grown semiconductor hetero-structures, such as in compound semiconductor materials like III-V systems. Such devices offer the promise of exceptionally high carrier mobility in the transistor channels due to low effective carrier mass.

However, the electrically poor quality native oxide (e.g., in contrast to $SiO_2$ for silicon-based devices) formed by compound semiconductor materials has hindered widespread adoption of III-V semiconductor transistor devices. While some have proposed growing a high-K material in-situ with the formation of an underlying semiconductor layer, such procedures require an expensive molecular beam epitaxy (MBE) technique and also high temperatures (e.g., 600° C.) which preclude the use of certain semiconductor materials which have low decomposition temperatures (e.g., InP) and are also not compatible with "gate-last" processing in which a gate stack is formed after formation and anneal of source/drain regions of the QWFET device.

BRIEF DESCRIPTION OF THE DRAWINGS

The present invention is illustrated by way of example, and not by way of limitation, in the figures of the accompanying drawings, in which.

DETAILED DESCRIPTION

Figure 1:
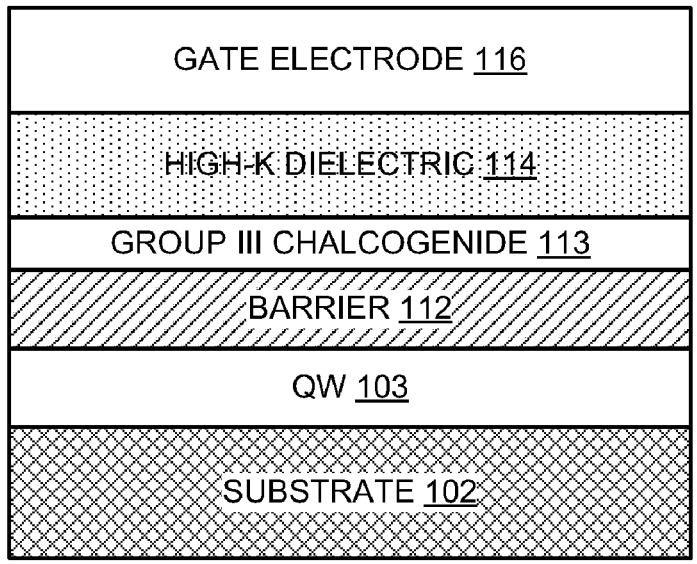
FIG. 1 illustrates a cross-sectional view of a quantum-well-based semiconductor device, in accordance with embodiments of the present invention.

Group III chalcogenides for interfacing a high-K dielectric layer to a III-V compound semiconductor surface are described. In the following description, numerous specific details are set forth, such as material compositions and film characteristics, in order to provide a thorough understanding of embodiments of the present invention. It will be apparent to one skilled in the art that embodiments of the present invention may be practiced without these specific details. In other instances, well-known features, such as patterning processes, are not described in detail in order to not unnecessarily obscure embodiments of the present invention. Furthermore, it is to be understood that the various embodiments shown in the Figures are illustrative representations and are not necessarily drawn to scale.

The terms "over," "under," "between," and "on" as used herein refer to a relative position of one media layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

Disclosed herein are III-V semiconductor devices utilizing a Group III chalcogenide as an interfacial layer with a high-K gate dielectric layer to form, ex-situ from the semiconductor growth, a gate stack of a metal-insulator-semiconductor (MIS)-type device. While the interfacial layer is describe herein as a part of a gate stack for a QWFET, it should be appreciated that the embodiments so described may be readily adapted to other devices which may also benefit from a chemically sharp III-V semiconductor-to-high-K dielectric layer interface (e.g., MOS capacitors, etc.) formed ex-situ from the III-V semiconductor.

In one embodiment, a III-V FET device includes a III-V semiconductor substrate onto which a pair of source/drain regions is disposed. An interfacial layer is disposed over the semiconductor substrate in a channel region between the pair of separated source/drain regions as an interface to a gate dielectric material having a high dielectric constant ("high-K"). The interfacial layer provides a chemically sharp interface with the III-V substrate that is substantially free of native oxide. A gate electrode is further disposed over the high-K gate dielectric layer to capacitively control the channel region.

Also disclosed herein are methods of forming the interfacial layer as a surface passivating layer and, more particularly, for forming the interfacial layer as part of gate dielectric stack in a III-V FET device ex-situ from the formation of the underlying III-V semiconductor channel. In one embodiment, a trench is formed over the channel region of the quantum-well-based semiconductor device to form a separation in a source/drain layer into which the interfacial and second gate dielectric layers are sequentially formed. A gate electrode is then formed in the trench, over the gate dielectric stack, to control the channel region.

Because III-V semiconductor materials lack a good quality native oxide, a transition from the channel semiconductor to a non-native dielectric is provided herein to form high quality dielectric layer (e.g., one having sufficiently low leakage that a MIS can be formed).

While various surface cleaning and passivating treatments known for III-V semiconductor substrates may provide termination groups to the III-V semiconductor surface, such termination groups may be present only at defect sites rather than cover the entire semiconductor surface. Such termination groups may also either be replaced entirely by reactive species during subsequent film deposition (e.g., a dielectric layer) or form bonds to the subsequently formed film having a variety of states in which dangling bonds remain. Furthermore, because the termination groups that result from surface treatments may not provide a sufficient barrier to prevent latent oxidation of the III-V semiconductor surface by species in the high-K dielectric layer, it is difficult maintain a chemically sharp semiconductor interface below the dielectric layer even when a native oxide is removed prior to forming a non-native dielectric layer on the III-V semiconductor surface.

The interfacial layer embodiments described herein overcome these difficulties by exposing a III-V semiconductor surface to group III chalcogenide growth. For the embodiments described herein, the group III-chalcogenide film formed on the semiconductor surface has thermodynamically stable bonding at the III-V semiconductor interface as well as through the group III-chalcogenide bulk. As the interfacial layer is formed with species that are made available throughout the duration of the formation process, as opposed to being limited to surface termination groups, the species in the interfacial layer may further be characterized as homogenous. In the embodiments described herein, the interfacial layer formation process both removes native oxides from the III-V surface and forms a group III-chalcogenide layer of sufficient thickness to provide a more significant barrier to latent oxidation of the III-V surface than does a surface treatment.

In accordance with certain embodiments of the present invention, one or more of the gate-last approaches described herein which utilize the ability to form a good quality high-K dielectric to III-V semiconductor interface enable the use of a QW materials and/or doped source/drain regions that would otherwise deteriorate and/or extensively diffuse at temperatures required for an in-situ MBE gate dielectric growth (e.g., above approximately 500 degrees Celsius).

Figure 2:
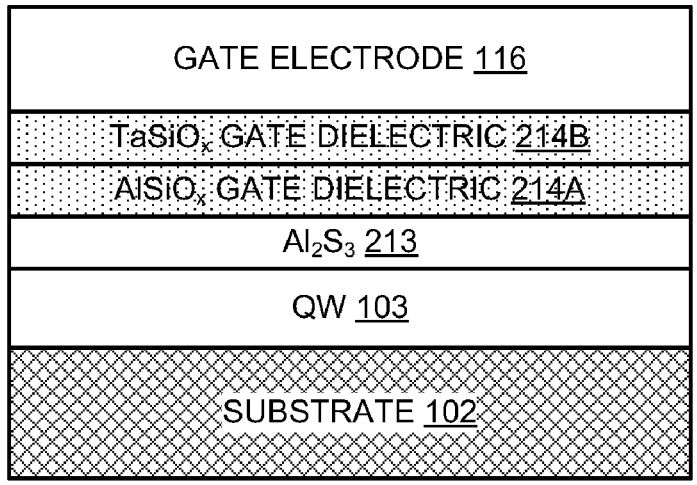
FIG. 2 illustrates a cross-sectional view of a quantum-well-based semiconductor device, in accordance with an embodiment of the present invention.

FIG. 1 depicts a stack of material layers forming a semiconductor channel region, a gate dielectric and a gate electrode for a III-V QWFET stack 100. As one of skill in the art will appreciate, the stack depicted in FIG. 1 may be adapted to control a current between a pair of source drain regions (not depicted) disposed on either side of the channel region. FIG. 2 depicts a stack of material layers forming a semiconductor channel region, a gate dielectric and a gate electrode for an exemplary III-V QWFET stack 200 as a particular implementation of the more general stack depicted in FIG. 1.

Referring to FIGS. 1 and 2, a III-V semiconductor device is formed on a substrate 102 composed of a material suitable for semiconductor device fabrication. In one embodiment, substrate 102 is a bulk substrate composed of a single crystal of a material which may include, but is not limited to, silicon, germanium, silicon-germanium or a III-V compound semiconductor material. In another embodiment, substrate 102 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 102 includes a top epitaxial layer on a middle insulator layer which is above a lower bulk layer. The top epitaxial layer is composed of a single crystal layer which may include, but is not limited to, silicon (e.g., to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 102 may further include dopant impurity atoms.

Disposed over the substrate 102 is a quantum-well (QW) channel region 103 which is composed of one or more material layers suitable to propagate a wave-function with low resistance. In accordance with an embodiment of the present invention, the QW channel region 103 has a lattice constant suitably matched to the substrate 102 (e.g., the lattice constants are similar enough that dislocation formation in QW channel region 103 does not render the device inoperable). In alternative embodiments, the QW channel region 103 has a lattice constant suitably matched to that of a bottom barrier layer of a hetero-structure (not shown) disposed between the QW channel region 103 and the substrate 102. In certain embodiments, the QW channel region 103 is composed of germanium or a II-VI semiconductor material. In other embodiments, the QW channel region 103 is composed of groups III (e.g. boron, aluminum, gallium or indium) and V (e.g. nitrogen, phosphorous, arsenic or antimony) elements. In the exemplary embodiment of the III-V QWFET stacks 100, 200 depicted in FIGS. 1 and 2, the III-V QW channel region 103 is composed of InAs, InSb, InGaAs, or GaAs. Depending on the materials utilized, the QW channel region 103 has a physical thickness approximately in the range of 50-200 nanometers.

A stack of one or more crystalline semiconductor layers, such as a compositional buffer layer with a bottom barrier layer disposed thereon may be required between the QW channel region 103 and the substrate 102. The compositional buffer layer may be composed of a crystalline material suitable to provide a specific lattice structure onto which a bottom barrier layer may be formed with negligible dislocations. The compositional buffer layer may be used to change, by a gradient of lattice constants, the exposed growth surface from the lattice structure of substrate 102 to one that is more compatible for epitaxial growth of high quality, low defect density layers thereon. In an embodiment where the substrate 102 is composed of single-crystal silicon, a compositional buffer layer is composed of a layer of InAlAs having a physical thickness of approximately 1 micron. A bottom barrier layer (not shown) may be composed of a material suitable to confine a wave-function in the QW channel region 103 formed thereon. In one embodiment, a bottom barrier layer of approximately $In_{0.65}Al_{0.35}As$ having a physical thickness of approximately 10 nanometers (nm) is used for quantum confinement in an N-type semiconductor device. In another embodiment, the bottom barrier layer of approximately $In_{0.65}Al_{0.35}Sb$ having a thickness of approximately 10 nanometers is used for quantum confinement in a P-type semiconductor device.

A top barrier layer may be composed of a material suitable to confine a wave-function in the underlying quantum-well channel region. In accordance with an embodiment of the present invention, the barrier layer 112 depicted in FIG. 1 has a lattice constant suitably matched to the lattice constant of the QW channel region 103 (e.g., the lattice constants are similar enough that dislocation formation in barrier layer 112 is negligible). The barrier layer 112 may be a material such as, but not limited to gallium nitride (GaN), indium phosphide (InP), or indium gallium phosphide (InGaP) for III-V substrates or silicon germanium (SiGe) for germanium substrates. For the exemplary III-V embodiment, the barrier layer 112 is InP. The barrier layer 112 need not be employed however. For example, the barrier layer may be ultimately removed selectively from the III-V QWFET channel portions, leaving the barrier layer 112 only at the source/drain regions or the semiconductor stack may be grown in a manner which allows the III-V QWFET to avoid a barrier layer altogether.

As depicted in FIG. 1, a group III chalcogenide interfacial layer 113 is disposed over the QW 103. For embodiments including the barrier layer 112 (e.g., FIG. 1), the group III chalcogenide interfacial layer 113 is disposed on, in contact with, the barrier layer 112. Alternatively, where the barrier layer 112 is absent (e.g., FIG. 2), the group III chalcogenide interfacial layer ($Al_2S_3$ interfacial layer 213) is disposed directly on the QW channel region 103. Between these two embodiments, different III-V semiconductor materials are expected.

In embodiments, the group III chalcogenide includes at least one of the group III species Al, Ga, or In and at least one of the group VI species S, Se, Te. In one advantageous embodiment, the group III species is Al as the +1 oxidation states for both Ga and In are more difficult to avoid during the formation of the group III chalcogenide interfacial layer 113. In a further embodiment, the group III chalcogenide interfacial layer 113 includes both Al and S.

The group III chalcogenide interfacial layer 113 may have a physical thickness of between about 3 Å and 10 Å. In an embodiment, the group III chalcogenide interfacial layer 113 is a bulk layer having a thickness greater than a monolayer and may also be greater than two monolayers. For one bulk layer embodiment, as depicted in the exemplary embodiment of FIG. 2, an $Al_2S_3$ interfacial layer 213 is formed on the III-V semiconductor surface of the QW 103. In certain such bulk layer embodiments, the thickness of the group III chalcogenide interfacial layer 113 is sufficient that some aluminum species present in the group III chalcogenide interfacial layer 113 form bonds only with sulfur (i.e., not bonded to a III-V substrate species). The bulk layer embodiments may provide a better barrier to prevent the underlying III-V semiconductor from being oxidized by subsequent formation of a high-K dielectric layer over the group III chalcogenide interfacial layer 113. Prevention of such latent oxidation of the III-V surface serves to avoid formation of electrically leaky native oxide as well as non-stoichiometric semiconductor below such a native oxide that is generated when one group is oxidized preferentially over the other.

In a further embodiment, the top III-V surface of the barrier layer 112 (or QW 103 for embodiments where the barrier layer 112 is not present) that is in contact with the group III chalcogenide interfacial layer 113 is substantially free of group V oxides in the +3 oxidation state. Formation of native oxides on a III-V semiconductor surface may be preferential to either the group III or group V species as dependent on environmental conditions and the formation of group V oxides in the +3 oxidation state (e.g., $As_2O_3$ for an InGaAs surface) is frequently favored. Such group V oxides are difficult to eliminate from the semiconductor surface absent a high temperature decomposition (e.g., epitaxial semiconductor growth temperatures). It has been found however, that such an oxide is completely removed during the formation of the group III chalcogenide interfacial layer 113. Notably, the III-V surface below the group III chalcogenide interfacial layer 113 has also been found to be free of group III oxides (all oxidation states).

In embodiments, the uppermost III-V surface of the barrier layer 112 (or QW 103 for embodiments where the barrier layer 112 is not present) that is in contact with the group III chalcogenide interfacial layer 113 has the same stoichiometry as that of the bulk layer. For example, the stoichiometry of the barrier layer 112 is homogeneous throughout the thickness of the barrier layer 112 up to the group III chalcogenide interfacial layer 113. This homogeneity in the III-V semiconductor stoichiometry provides for a chemically sharp interface with the group III chalcogenide interfacial layer 113 and, as such, a chemically sharp interface with a subsequently formed high-K dielectric layer.

As further depicted in FIG. 1, disposed over the group III chalcogenide interfacial layer 113 is a high-K dielectric layer 114. In one embodiment, high-K dielectric layer 114 is a metal oxide having a dielectric constant between 10 and 24. In an embodiment, high-K dielectric layer 114 is composed of a high-K material such as, but not limited to, aluminum oxide ($Al_2O_3$), aluminum silicate ($AlSiO_x$), or hafnium oxide ($HfO_2$). In the exemplary embodiment depicted in FIG. 2, an aluminum silicate high-K dielectric layer 214A is disposed on the $Al_2S_3$ interfacial layer 213.

It should also be appreciated the high-K dielectric layer 114 may include one or more material layers having differing constituents and/or compositions. For example, a dual-layer high-K dielectric layer may be employed over the group III chalcogenide interfacial layer 113. In one such embodiment, as depicted in FIG. 2, a III-V QWFET employs an aluminum silicate high-K dielectric layer 214A disposed between the group III chalcogenide interfacial layer 113 and a tantalum silicate high-K dielectric layer 214B.

Disposed over the gate dielectric layer (114 in FIG. 1 or 214B in FIG. 2) is a gate electrode layer 116. In one embodiment, the gate electrode layer 116 is a metal gate electrode. Any metal known in the art may be selected to achieve the desired work function based on the particular materials in the quantum well channel region 103. In embodiments, the gate electrode layer 116 is composed of a material such as, but not limited to, a metal nitride, a metal carbide, a metal silicide, hafnium, zirconium, titanium, tantalum, aluminum, ruthenium, palladium, platinum, cobalt or nickel. A stack including a workfunction metal and a conductive metal cap or a stack of a workfunction metal and a conductive polycrystalline silicon, germanium, silicide, or germanicide may also be utilized for the gate electrode layer 116.

Figure 3:
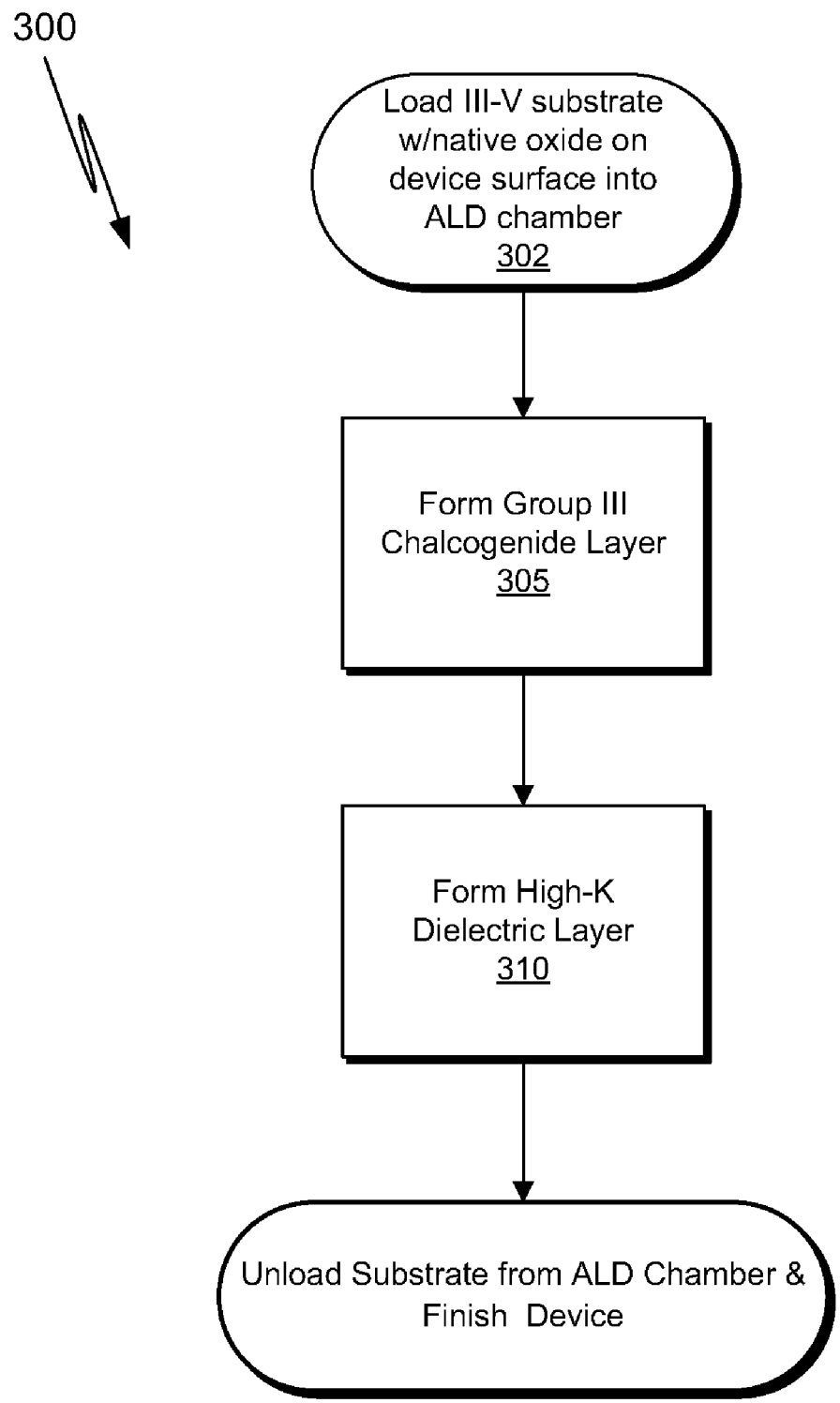
FIG. 3 is a flow diagram representing operations in the passivation of a III-V semiconductor surface, in accordance with an embodiment of the present invention.

As another embodiment of the present invention, a method for passivating a III-V semiconductor is provided. FIG. 3 is a flow diagram illustrating particular operations in a method 300 for passivating a III-V semiconductor surface. At operation 302, a substrate having a III-V semiconductor surface on which a native oxide is present is load into, or otherwise provided, to deposition chamber configured to perform metalorganic-CVD (MO-CVD) and/or atom layer deposition (ALD) in which two precursor gases are alternately and successively introduced into the chamber to react with an exposed surface of the substrate.

At operation 305, a group III metalorganic precursor and a chalcogenide precursor are introduced to the MO-CVD chamber to remove at least the group V oxides in the +3 oxidation state from the III-V semiconductor surface. In a further embodiment, all group III oxides are also removed. In the exemplary ALD embodiment, the group III metalorganic precursor is introduced alternately with the chalcogenide precursor. In one such embodiment, the TMA precursor is introduced to the substrate surface first. With the removal of the native oxides, a group III chalcogenide is formed on the semiconductor surface. Any of the materials described elsewhere herein for the group III chalcogenide interfacial layer 113 may be formed at operation 305. In one particular embodiment, the group III metalorganic precursor is trimethylaluminum (TMA) and the chalcogenide precursor is hydrogen sulfide ($H_2S$). Although not bound to any one theory of operation or mechanism, it is currently thought that the group III metalorganic precursor reacts with III-V native oxide such that the oxygen bonds with the organic groups from the precursor and is rendered volatile with the metallic bonding to the semiconductor surface. For example, the TMA half-reaction for an ALD cycle may further result in the aluminum bonding to group-III species of the III-V semiconductor surface. The chalcogenide half-reaction for an ALD cycle may result in chalcogen bonding to the group V species of the III-V semiconductor. For example, $H_2S$ half-reaction for an ALD cycle may result in sulfur bonding to group-V species of the III-V semiconductor surface. Additional cycles are performed to ensure coverage of the III-V with at least a monolayer of an $Al_2S_3$ interfacial layer. In certain embodiments, enough ALD cycles are performed to two or more monolayers of $Al_2S_3$. While a number of III-V semiconductor materials have been found to respond favorably to this ALD growth of Al2S3, it should be noted that this process is particularly advantageous for InGaAs embodiments, many of which have been extensively tested and found to display a chemically sharp and stoichiometric III-V semiconductor interface. As such, processes described herein may enable a gate stack to be formed directly on a QW channel material of InGaAs, as described further elsewhere herein.

At operation 310, a high-K dielectric layer is formed on the group III chalcogenide layer. Any of the materials described elsewhere herein for the high-K dielectric layer 114 may be formed at operation 310. In one particular embodiment, in which an $Al_2S_3$ interfacial layer (e.g., 214 in FIG. 2) is formed at operation 305, an aluminum oxide layer is formed at operation 310 by replacing the $H_2S$ with either oxygen or an another oxidizing precursor known in the art to form aluminum oxide. For such embodiments, TMA may be used to form both the high-K dielectric layer and the interfacial layer such that the CVD (e.g., ALD) process may proceed seamlessly from the interfacial layer to the high-K dielectric layer. In a further embodiment including a bulk $Al_2S_3$ interfacial layer, formation of the high-K dielectric layer at operation 310 proceeds without forming a native oxide on the III-V surface disposed below the $Al_2S_3$ interfacial layer. The formation of the high-K dielectric layer also may proceed without significantly altering the stoichiometry of the III-V surface disposed below the $Al_2S_3$ interfacial layer from that of the sub-surface (bulk) III-V semiconductor.

Following operation 305, the method 300 is complete and the III-V substrate may be unloaded from the MO-CVD/ALD chamber. The device to be fabricated from the III-V substrate may then be finished using any method known in the art. In an exemplary embodiment, the method 300 is applied to the fabrication of a QWFET, as further illustrated in FIGS. 4A-4F. The cross-sectional views illustrate a QWFET as it is fabricated with the performance of selected operations, in accordance with an embodiment of the present invention.

In embodiments of the present invention, a method of forming a quantum-well-based HEMT device includes a gate-last or replacement gate method to fabricate group III-V or germanium quantum-well field effect transistor (QWFET) devices. This approach may enable: (1) all semiconductor materials, including source and drain material, to be grown first and then a trench is etched in the source and drain material to accommodate subsequent formation of a gate dielectric and a gate electrode; and (2) the group III-chalcogenide interfacial layer and the gate dielectric may be deposited by atomic layer deposition (ALD) or metal-organic chemical vapor deposition (MO-CVD) later in the process flow rather than forming a gate stack in-situ with semiconductor material growth (the high temperature of which might prohibit the use of certain materials, like InP, in the semiconductor QW structure).

Figure 4A:
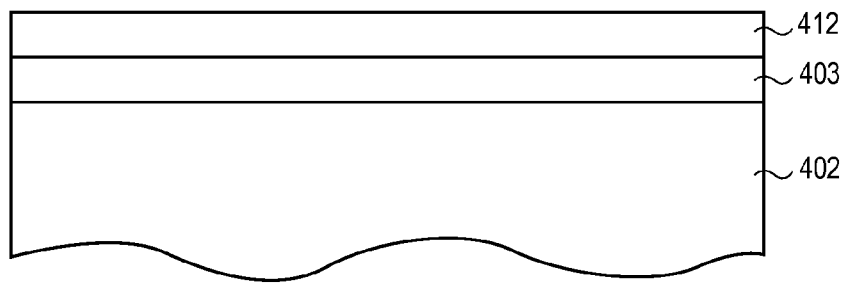
FIG. 4A illustrates a cross-sectional view representing formation of a quantum-well on a substrate, in accordance with an embodiment of the present invention.

Referring to FIG. 4A, a quantum-well-based semiconductor device begins with provision of a barrier layer 412 disposed on a quantum well structure 403 disposed above a substrate 402. The substrate 402 may be any of those described for substrate 102 in the context of FIGS. 1 and 2. Likewise, the barrier layer 412 and the quantum well structure 403 may be any of those described for the barrier layer 112 and quantum well channel regions 103, respectively. In an alternative embodiment, the barrier layer 412 may be omitted such that the quantum well structure 403 provides the top semiconductor surface (e.g., an InGaAs top surface).

Figure 4B:
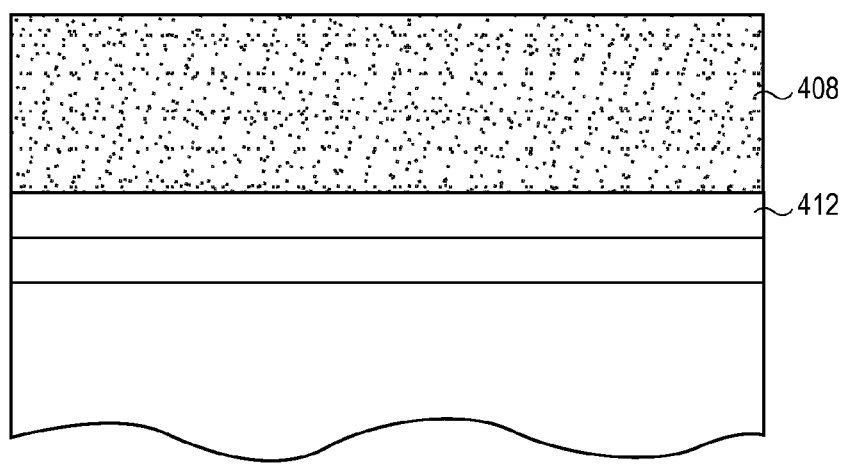
FIG. 4B illustrates a cross-sectional view representing formation of a pair of source/drain regions of a III-V device, in accordance with an embodiment of the present invention.

As illustrated in FIG. 4B a source/drain material layer 408 is first formed above the barrier layer 412. In accordance with an embodiment of the present invention, where the quantum well structure 403 includes a group III-V material, the source/drain material layer 408 is a doped group III-V semiconductor material. In one embodiment, forming the source/drain material layer 408 includes molecular-beam epitaxial deposition.

Figure 4C:
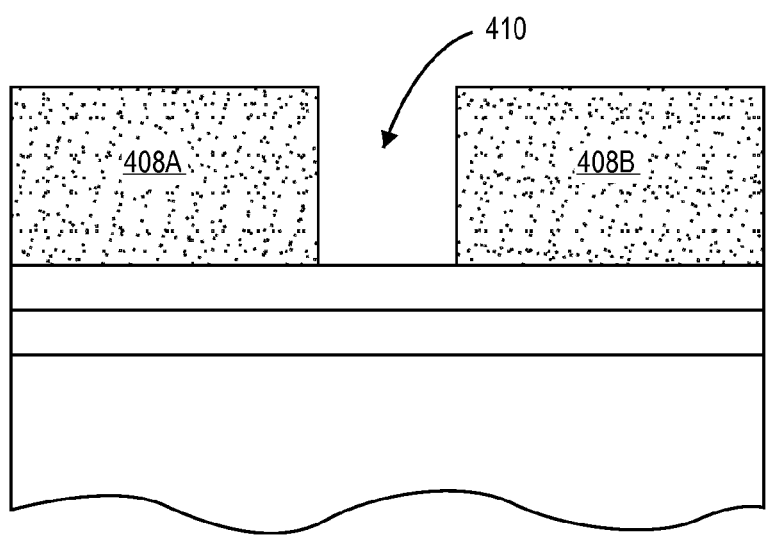
FIG. 4C illustrates a cross-sectional view representing formation of a trench over a channel region of the III-V device, in accordance with an embodiment of the present invention.

As further illustrated in FIG. 4C, a trench 410 is then formed in the source/drain material layer 408 to provide a source region 408A separated from a drain region 408B (i.e., pair of spaced-apart source/drain regions). In accordance with one embodiment, the trench 410 is formed by a dry or wet etch process and the top surface of the barrier layer 412 acts as an etch stop, as depicted in FIG. 4C. In accordance with an alternative embodiment of the present invention, trench 410 is formed by a dry or wet etch process and the top surface of the quantum well structure 403 provides an etch stop (e.g., the barrier layer 412 is etched through). For this embodiment, like those omitting the barrier layer 412, the quantum well structure 403 provides a top surface of the III-V semiconductor (e.g., an InGaAs surface).

Figure 4D:
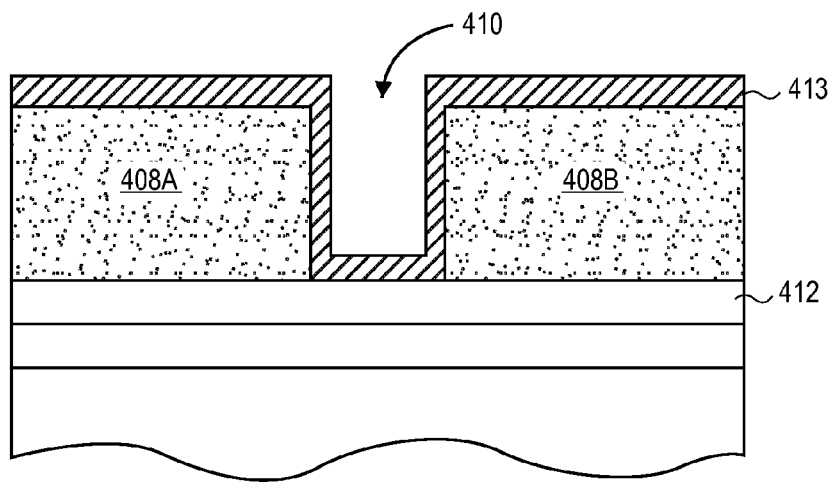
FIG. 4D illustrates a cross-sectional view representing formation of a interfacial layer of the III-V device, in accordance with an embodiment of the present invention.

As further illustrated in FIG. 4D, a group III chalcogenide layer 413 is formed in the trench 410 to be in contact with the barrier layer 412. The group III chalcogenide layer 413 may be formed by either by atomic layer deposition (ALD) and/or metal-organic chemical vapor deposition (MO-CVD) to achieve any of the material compositions described elsewhere herein for the group III chalcogenide interfacial layer 113 (or, more specifically, the $Al_2S_3$ interfacial layer 213) using the precursors described for operation 305 (FIG. 3). Any other precursors and processing equipment conventional in the art for forming such a material layer may also be used.

Figure 4E:
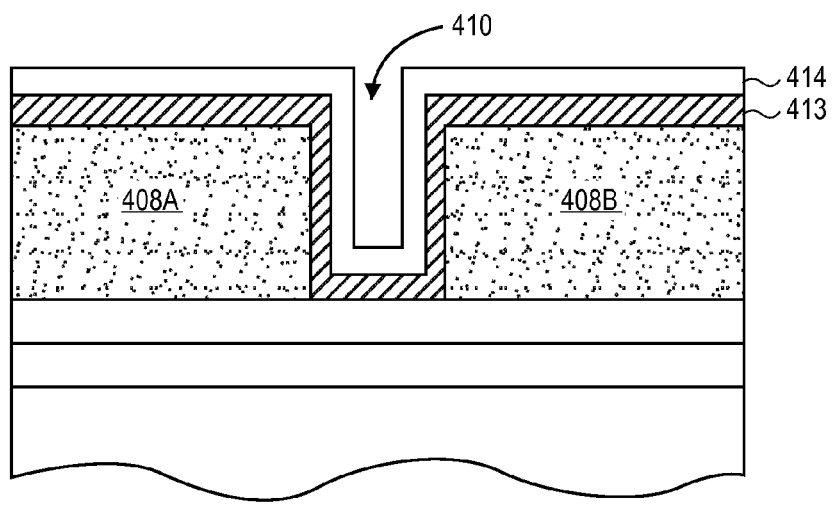
FIG. 4E illustrates a cross-sectional view representing formation of a gate dielectric layer of the III-V device, in accordance with an embodiment of the present invention.

As illustrated in FIG. 4E, a gate dielectric layer 414 is then deposited in the trench 410, between the source and drain regions 408A and 408B to be in contact with the group III chalcogenide layer 413. The second gate dielectric layer 414 may be formed either by atomic layer deposition (ALD) and/or metal-organic chemical vapor deposition (MO-CVD) to achieve any of the material compositions described elsewhere herein for the high-K dielectric layer 114 using known precursors and processing equipment conventional in the art. In a particular embodiment, the gate dielectric layer 414 is formed as described elsewhere herein for operation 310 (FIG. 3).

Figure 4F:
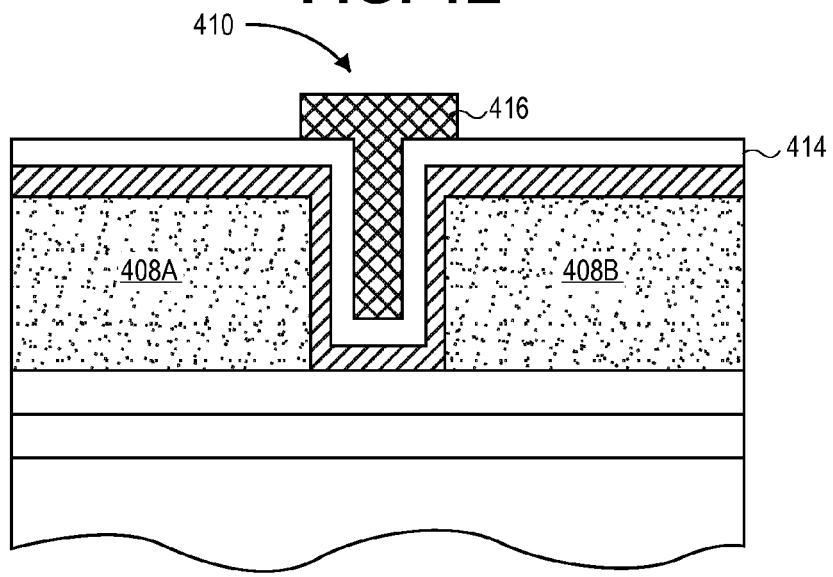
FIG. 4F illustrates a cross-sectional view representing formation of a gate electrode, in accordance with an embodiment of the present invention.

With the gate dielectric formed, a gate electrode is then formed as depicted in FIG. 4F. A gate electrode material is deposited in the trench 410, on the gate dielectric layer 414. Any of the materials described for the gate electrode layer 116 may be utilized. In accordance with an embodiment of the present invention, the gate electrode material is a metal deposited and then patterned by lithography or polishing schemes known in the art to form the gate electrode 416.

In the foregoing specification, embodiments of the invention have been described with reference to specific exemplary features thereof. It will, however, be evident that various modifications and changes may be made thereto without departing from the broader spirit and scope of the invention as set forth in the appended claims. The specification and figures are, accordingly, to be regarded in an illustrative rather than a restrictive sense.

What is claimed is:

1. A field effect transistor (FET) formed on a III-V compound semiconductor, comprising:
   a III-V semiconductor layer;
   a pair of separated source/drain regions in or over the III-V semiconductor layer with a channel region disposed there between;
   an interfacial layer in direct contact with a top III-V semiconductor surface of the channel region, wherein the interfacial layer comprises a group III chalcogenide further comprising Al and S;
   a high-K gate dielectric layer in direct contact with the interfacial layer on a side of the interfacial layer opposite the to III-V semiconductor surface; and
   a gate electrode disposed over the high-K gate dielectric layer to control the channel region.

2. The FET as in claim 1, wherein the group III chalcogenide consists essentially of Al and S.

3. The FET as in claim 2, wherein the interfacial layer is a bulk $Al_2S_3$ film having a thickness greater than a monolayer.

4. The FET as in claim 3, wherein the top semiconductor surface comprises InGaAs.

5. The FET as in claim 1, wherein the top semiconductor surface is substantially free of group III and group V oxides.

6. The FET as in claim 1, wherein the top semiconductor surface has the same III-V stoichiometry as the bulk of the III-V semiconductor layer.

7. The FET as in claim 1, wherein the high-K gate dielectric layer comprises a metal oxide having dielectric constant between 10 and 24.

8. The FET as in claim 7, wherein the high-K gate dielectric layer comprises an aluminum oxide or aluminum silicate layer in contact with the interfacial layer.

9. A method of forming a field effect transistor (FET) on a III-V compound semiconductor, comprising:
   forming a pair of source/drain regions in or over a III-V semiconductor layer with a channel region disposed there between;
   forming an interfacial layer in direct contact with a top III-V semiconductor surface of the channel region, wherein forming the interfacial layer further comprises:
      providing, to an MOCVD chamber, the III-V semiconductor layer with a native oxide on a III-V semiconductor surface of the channel region; and
      introducing a group III metalorganic precursor alternately with a chalcogenide precursor to remove the native oxide and to form a group III chalcogenide layer on the III-V semiconductor surface;
   forming a high-K gate dielectric layer in direct contact with the interfacial layer on a side of the interfacial layer opposite the top III-V semiconductor surface; and
   forming a gate electrode over the high-K gate dielectric layer to control the channel region.

10. The method as in claim 9, wherein the removal of the native oxide renders the III-V semiconductor surface with a same stoichiometry as that of the bulk III-V semiconductor layer.

11. The method as in claim 9, wherein the group III metalorganic precursor comprises a precursor for Al, Ga, or In.

12. The method as in claim 11, wherein the group III metalorganic precursor comprises trimethylaluminum (TMA) and wherein the chalcogenide precursor comprises $H_2S$ to form an interfacial layer comprising $Al_2S_3$.

13. The method as in claim 12, wherein the group III metalorganic precursor and chalcogenide precursor are introduced in an alternating manner to form the group III chalcogenide layer by atomic layer deposition (ALD) to a thickness greater than two monolayers.

14. The method as in claim 12, wherein the III-V semiconductor layer comprises InGaAs and wherein forming the high-K gate dielectric layer further comprises:
   replacing at least the chalcogenide precursor with another precursor to form a layer of aluminum oxide on the $Al_2S_3$ interfacial layer.

15. A method of passivating a III-V semiconductor surface comprising:
   providing, to a MOCVD chamber, a substrate with a native oxide present on a III-V semiconductor surface; and
   introducing a group III metalorganic precursor comprising trimethylaluminum (TMA) and a chalcogenide precursor comprising $H_2S$ to remove the native oxide from the III-V semiconductor surface and form a group III chalcogenide on the III-V semiconductor surface, wherein the group III metalorganic precursor and the chalcogenide precursor are introduced sequentially and cyclically to form the group III chalcogenide by atomic layer deposition (ALD).

16. The method as in claim 15, further comprising forming a high-k dielectric layer over the group III chalcogenide, wherein the group III comprises $Al_2S_3$, and wherein forming the high-k dielectric layer further comprises:
   replacing, during the deposition, the precursor comprising $H_2S$ with another precursor to form a layer of aluminum oxide on the group III chalcogenide comprising $Al_2S_3$.

17. The method of claim 15, wherein the group III metalorganic precursor comprising trimethylaluminum (TMA) is introduced to the III-V semiconductor surface before the chalcogenide precursor comprising $H_2S$ is introduced.

* * * * *